United States Patent [19]
Tateishi et al.

[11] Patent Number: 5,399,438
[45] Date of Patent: Mar. 21, 1995

[54] STAINLESS STEEL MEMBER AND METHOD OF MANUFACTURING STAINLESS STEEL MEMBER

[75] Inventors: Hiroshi Tateishi; Kiyoshi Imai; Hideyuki Ohzu, all of Yokohama; Kazuaki Nakagawa, Urayasu; Yoshihiro Akasaka, Yokohama, all of Japan

[73] Assignee: Kabushiki Kaisha Toshiba, Kawasaki, Japan

[21] Appl. No.: 120,335

[22] Filed: Sep. 14, 1993

[30] Foreign Application Priority Data

Sep. 14, 1992 [JP] Japan .................................. 4-245275
Jun. 25, 1993 [JP] Japan .................................. 5-154922

[51] Int. Cl.⁶ .............................. B22F 1/00; B22F 3/00
[52] U.S. Cl. .................................... 428/548; 428/547; 428/553; 419/5; 419/8; 419/9; 419/10; 419/36; 419/38; 419/40; 419/44; 419/46; 419/56; 419/58
[58] Field of Search .................... 428/548, 553; 419/5, 419/8, 9, 10, 36, 38, 40, 44, 46, 56, 58

[56] References Cited

U.S. PATENT DOCUMENTS 4,518,457 5/1985 Gray ..................................... 156/656
4,977,036 12/1990 Baldi ..................................... 428/553

OTHER PUBLICATIONS

C. Y. Yuh, P. Singh, L. Paetsch and H. C. Maru Paper 276, NACE "Corrosion/87", San Francisco, Calif. Mar. 9–13, 1987, pp. 1–22.

*Primary Examiner*—Donald P. Walsh
*Assistant Examiner*—John N. Greaves
*Attorney, Agent, or Firm*—Oblon, Spivak, McClelland, Maier & Neustadt

[57] ABSTRACT

Disclosed is a stainless steel member with a high corrosion resistance suitable for a structural member used in highly corrosive environments, such as an edge seal plate of a molten carbonate fuel cell. This stainless steel member includes a base material consisting of stainless steel containing chromium, and a corrosion-protective layer formed on the surface of the base material. In this corrosion-protective layer, a granular heterophase containing chromium is precipitated in an ordered alloy consisting of aluminum and the constituent elements of the base material.

18 Claims, 3 Drawing Sheets

STAINLESS STEEL MEMBER AND METHOD OF MANUFACTURING STAINLESS STEEL MEMBER

BACKGROUND OF THE INVENTION

1. Field of the Invention

The present invention relates to a stainless steel member and a method for manufacturing the same and, more particularly, to a stainless steel member suitable for a structural member used in highly corrosive environments, such as an edge seal plate to be incorporated together with an electrolyte body into a molten carbonate fuel cell and brought into contact with the peripheral portion of the electrolyte body, and a method for manufacturing the same.

2. Description of the Related Art

Conventionally, various types of fuel cells have been proposed and put into practical use. A molten carbonate fuel cell, among other fuel cells, has been researched and developed extensively because it has a high efficiency and makes the use of coal gas as a fuel gas possible.

The molten carbonate fuel cell has a structure in which a plurality of unit cells, each constituted by a fuel electrode, an air electrode, an electrolyte body, and a collector plate, are stacked with separators arranged between them. Each separator has two edge seal plates so arranged as to clamp the peripheral portion of the electrolyte body containing molten carbonates. The edge seal plates form a wet seal by contacting the peripheral portion of the electrolyte body to thereby shield the electric power generating parts of the unit cells from the external atmosphere. Spring members apply a predetermined surface pressure from both sides to the portions of the edge seal plates clamping the peripheral portion of the electrolyte body, thereby maintaining the wet seal properties of the edge seal plates.

The edge seal plates have been conventionally made of stainless steel with a relatively high corrosion resistance. SUS316, SUS316L, or SUS310S, among other stainless steel materials, is particularly widely used because of its very high corrosion resistance.

The edge seal plates contacting the peripheral portion of the electrolyte body, however, are in direct contact with the molten carbonates which are highly corrosive. Therefore, stainless steel as the material of the edge seal plates corrodes, forming a corrosion product. The corrosion product on any two edge seal plates sandwiching the electrolyte body contact each other. Furthermore, the corrosion products contact the fuel electrode and the air electrode sandwiching the electrolyte body, respectively. Consequently, a short circuit is formed between the fuel electrode and the air electrode, inevitably shortening the lifetime of the cell.

For this reason, it is common practice to manufacture edge seal plates improved in corrosion resistance by coating aluminum on the surface of a base material consisting of stainless steel and performing a heat treatment at a temperature of 900° C. or more to diffuse the aluminum into the base material, thereby forming a corrosion-protective layer. Since, however, cracks reaching the stainless steel as the base material are formed in the corrosion-protective layer, corrosion develops at the portions of the stainless steel where the cracks have reached, adversely affecting the life of a cell.

SUMMARY OF THE INVENTION

It is an object of the present invention to provide a stainless steel member on the surface of which a corrosion-protective layer is formed and which therefore has a high corrosion resistance.

It is another object of the present invention to provide a method capable of very easily manufacturing a stainless steel member on the surface of which a corrosion-protective layer is formed and which therefore has a high corrosion resistance.

According to the present invention, there is provided a stainless steel member comprising:
 a base material consisting of stainless steel containing chromium; and
 a corrosion-protective layer in which a granular heterophase containing chromium is precipitated in an ordered alloy consisting of aluminum and constituent elements of the base material.

In addition, according to the present invention, there is provided a method for manufacturing a stainless steel member, comprising the steps of:
 forming an aluminum layer on the surface of a base material consisting of stainless steel containing chromium; and
 performing a heat treatment in a non-oxidizing atmosphere at a temperature of 670° to 840° C., thereby forming, on the surface of the base material, a corrosion-protective layer in which a granular heterophase containing chromium is precipitated in an ordered alloy consisting of aluminum and constituent elements of the base material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
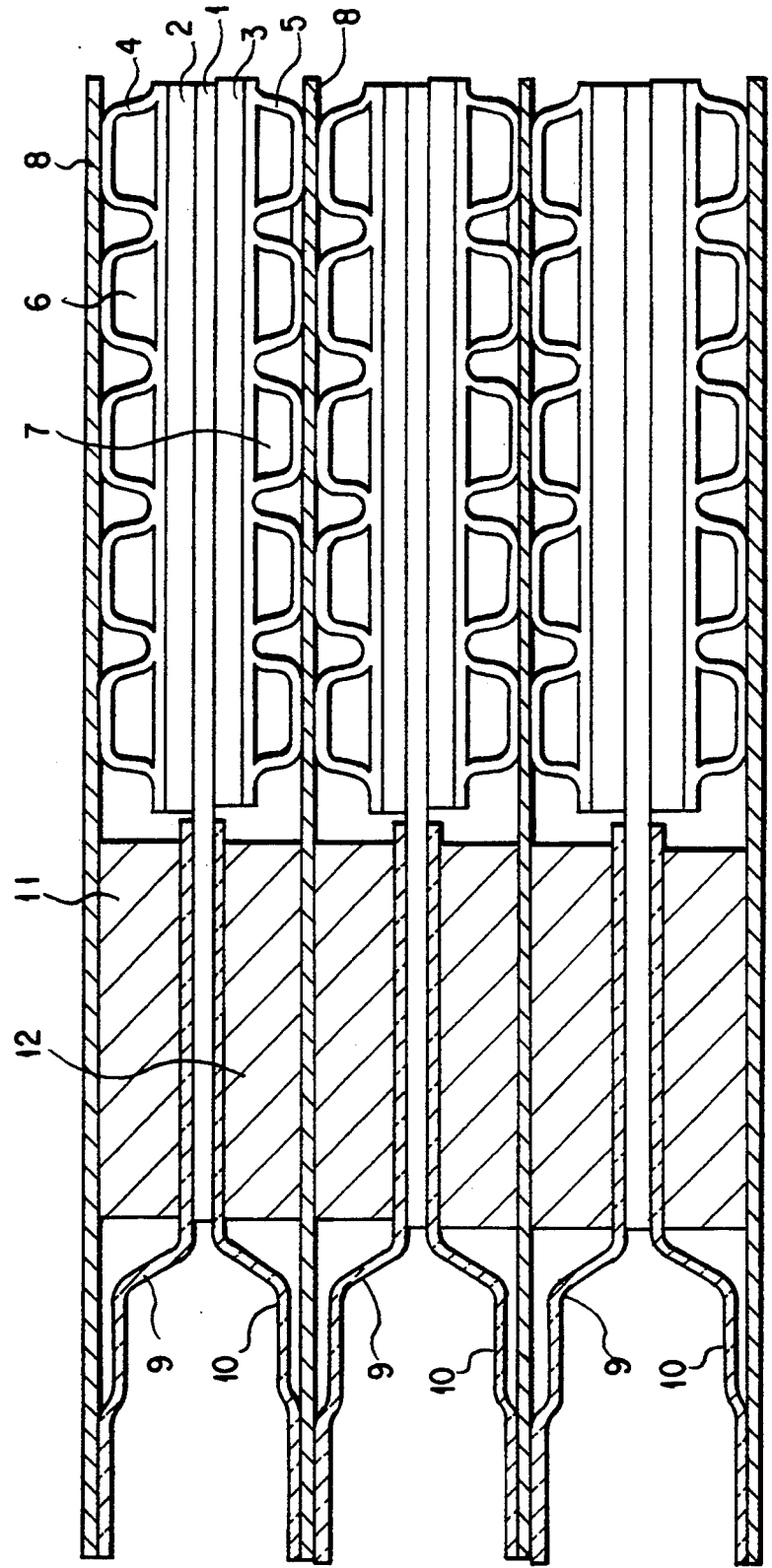
FIG. 1 is a sectional view showing a portion of a stack of a molten carbonate fuel cell.

A stainless steel member according to the present invention comprises:
- a base material consisting of stainless steel containing chromium; and
- a corrosion-protective layer in which a granular heterophase containing chromium is precipitated in an ordered alloy consisting of aluminum and constituent elements of the base material.

The base material consists of stainless steel having a composition containing 10 to 27 wt % of chromium, 0.1 to 30 wt % of nickel, 0.08 wt % or less of cobalt, 2.0 wt % or less of manganese, 1.5 wt % or less of silicon, the balance of iron, and 0.1 wt % or less of unavoidable impurity elements. This stainless steel may further contain 5 wt % or less of at least one element selected from molybdenum, niobium, titanium, hafnium, boron, and aluminum as needed.

The ordered alloy contains, for example, aluminum and, as main components of the base material, iron and nickel, or aluminum and, as main components of the base material, iron, nickel, and chromium.

The granular heterophase preferably contains 15 to 60 wt % of chromium and constituent elements of the ordered alloy as the balance. The amount of silicon (Si) in the granular heterophase is preferably 5 wt % or less. It is particularly preferred that the granular heterophase contain $Al_8Cr_5$ that is detectable by an X-ray diffraction process.

The granular heterophase preferably has a grain size of 0.5 to 15 $\mu$m. If the grain size of the granular heterophase is less than 0.5 $\mu$m, the corrosion-protective layer will more likely have cracks reaching the surface of the based material. If the grain size of the granular heterophase exceeds 15 $\mu$m, there is a possibility that the corrosion-protective layer will have portions having insufficient corrosion resistance. The grain size of the granular heterophase is more preferably 1.0 to 10 $\mu$m.

It is desired that the corrosion-protective layer have a thickness of 20 to 100 $\mu$m, more preferably 35 to 100 $\mu$m. In the corrosion-protective layer with this thickness, the granular heterophase is preferably distributed in a region with a thickness of 5 to 40 $\mu$m from the interface between the base material and the corrosion-protective layer toward the corrosion-protective layer. In a case wherein the granular heterophase contains $Al_8Cr_5$, this granular heterophase may form a chain distribution parallel to the interface in the corrosion-protective layer.

The stainless steel member according to the present invention is applied to, for example, edge seal plates to be assembled into a molten carbonate fuel cell. A molten carbonate fuel cell including such edge seal plates will be described below with reference to FIG. 1. FIG. 1 is a sectional view showing a portion of a stack of a molten carbonate fuel cell having a structure in which a plurality of unit cells are stacked. An electrolyte body 1 is arranged between an anode (fuel electrode) 2 and a cathode (air electrode) 3. The electrolyte body 1 is formed by impregnating an electrolyte consisting of an alkaline carbonate into a porous material. Corrugated collector plates 4 and 5 are arranged on the surfaces of the fuel electrode 2 and the air electrode 3, respectively, away from their other surfaces on the side of the electrolyte body 1. A fuel gas ($H_2O$ or $CO_2$) flows through a flow path 6 formed by the fuel electrode 2 and the collector plate 4. An oxidant gas (air or $CO_2$) flows through a flow path 7 formed by the air electrode 3 and the collector plate 5. A unit cell is constituted by the electrolyte body 1, the fuel electrode 2, the air electrode 3, and the collector plates 4 and 5. Separators are arranged between a plurality of stacked unit cells to serve as partitions of the unit cells. Each separator includes an interconnector 8 for separating the flow paths 6 and 7, and two edge seal plates 9 and 10 so arranged as to clamp the peripheral portion of the electrolyte body 1. The edge seal plates 9 and 10 form a wet seal by contacting the peripheral portion of the electrolyte body 1, shielding the electric power generating parts of the unit cells from the external atmosphere. Spring members 11 and 12 apply a surface pressure of normally 5 kg/cm$^2$ or less from both sides to the portions of the edge seal plates 9 and 10 clamping the peripheral portion of the electrolyte body 1, thereby maintaining the wet seal properties of the edge seal plates 9 and 10.

A method for manufacturing a stainless steel member according to the present invention comprises the steps of:
- forming an aluminum layer on the surface of a base material consisting of stainless steel containing chromium; and
- performing a heat treatment in a non-oxidizing atmosphere at a temperature of 670° to 840° C., thereby forming, on the surface of the base material, a corrosion-protective layer in which a granular heterophase containing chromium is precipitated in an ordered alloy consisting of aluminum and constituent elements of the base material.

The base material consists of stainless steel having a composition containing 10 to 27 wt % of chromium, 0.1 to 30 wt % of nickel, 0.08 wt % or less of cobalt, 2.0 wt % or less of manganese, 1.5 wt % or less of silicon, the balance of iron, and 0.1 wt % or less of unavoidable impurity elements. This stainless steel may further contain 5 wt % or less of at least one element selected from molybdenum, niobium, titanium, hafnium, boron, and aluminum as needed.

The aluminum layer is formed by, for example, coating a slurry containing an aluminum particles and a binder on the surface of the base material and removing the binder. This aluminum particles preferably has a grain size of, e.g., 1 to 50 $\mu$m. The aluminum particles may be tabular, having a thickness of 1 $\mu$m and a diameter of 10 $\mu$m. Usable examples of the binder are stylene resin or mixture of polyvinyl butyral and di-n-butyl phthalate. The aluminum layer formed by using above process preferably has a thickness of 100 $\mu$m or more. Preferably, the aluminum layer is 1,500 $\mu$m thick at most.

It is also possible to form the aluminum layer on the surface of the base material by a physical vapor deposition process, such as an ion vapor deposition process or a sputter vapor deposition process, or an electroplating process, in addition to the above process. The aluminum layer formed by using the above process such as the vapor deposition process preferably has a thickness of 20 $\mu$m to 100 $\mu$m.

The non-oxidizing atmosphere in the heat-treatment step described above is realized by the use of an inert gas, such as At, He, or Ne, nitrogen gas, or a gas mixture (reducing gas) of hydrogen and an inert gas or nitrogen gas.

The temperature in the heat-treatment step is defined for the reason explained below. If the heat-treatment temperature is less than 670° C., diffusion of aluminum into the base material does not proceed sufficiently, making formation of a corrosion-protective layer with a desired performance difficult. If, on the other hand, the heat-treatment temperature exceeds 840° C., cracks reaching the surface of the base material are produced in the corrosion-protective layer formed. A heat-treatment temperature exceeding 840° C. also makes it difficult to produce a heterophase containing chromium in the corrosion-protective layer. The heat-treatment temperature is more preferably 780° to 820° C.

Assuming that the heat-treatment time is H (hr) and the heat-treatment temperature is T (K), the heat-treatment step is preferably so performed as to satisfy the relation of $0.1 \leq H \leq 0.02 \times 10^{(3300/T)}$. If the heat-treatment time H is less than 0.1 hr, it becomes difficult to form an even corrosion-protective layer on the entire surface of the base material. If the heat-treatment time exceeds $0.02 \times 10^{(3300/T)}$, on the other hand, cracks reaching the surface of the base material become are easily produced in the corrosion-protective layer formed.

According to the present invention, there can be provided a stainless steel member with a high corrosion resistance by forming, on the surface of a base material consisting of stainless steel containing chromium, a corrosion-protective layer in which a granular heterophase containing chromium is precipitated in an ordered alloy consisting of aluminum and constituent elements of the base material. This stainless steel member according to the present invention can be effectively applied to edge seal plates used in a highly corrosive environment in which they are brought into contact with the peripheral portion of an electrolyte body. As a result, the life of a molten carbonate fuel cell including these edge seal plates can be prolonged. The stainless steel member according to the present invention is also effectively applicable to, e.g., automobile mufflers, combustion catalyst carriers, and heat-resistant filters.

In addition, according to the method of the present invention, it is possible to manufacture a stainless steel member with a high corrosion resistance by forming an aluminum layer on the surface of a base material consisting of stainless steel containing chromium, and performing a heat treatment in a non-oxidizing atmosphere at a predetermined temperature, thereby forming, on the surface of the base material, a corrosion-protective layer in which a granular heterophase containing chromium is precipitated in an ordered alloy consisting of aluminum and constituent elements of the base material and no cracks reaching the surface of the base material exist.

The present invention will be described in more detail below by way of its preferred examples.

EXAMPLE 1

A predetermined amount of an aluminum slurry consisting of 70 wt % of an aluminum powder with an average diameter of 10 μm and 30 wt % of a styrene-based binder dispersed in a ketone-based solvent was coated on the surface of a 0.4 mm thick thin plate consisting of stainless steel (SUS316L), and the solvent was volatilized to form an aluminum-containing layer 200 μm in thickness. Subsequently, the resultant thin plate was placed in an oven having an argon atmosphere containing 3% of hydrogen. The binder in the aluminum-containing layer was volatilized by heat-treating at a temperature of 490° C. for twenty hours and heat-treated at a temperature of 750° C. for five hours. The thin plate was then oven-cooled at a cool-down rate of 1° C./min, thereby manufacturing a stainless steel member in which a corrosion-protective layer with a thickness of 35 μm was formed on the surface of the thin plate.

A plurality of samples of 10 cm square were cut out from the resultant stainless steel member by using a laser process. Some of these samples were buried in a cold-setting resin. The remaining samples were cut by a micro-cutter to form samples for X-ray diffraction, and the compositions of their corrosion-protective layers were examined by X-ray diffraction analysis. As a result, $Al_{13}Fe_4$ structure material was detected as an ordered alloy with the highest diffraction intensity.

Figure 2:
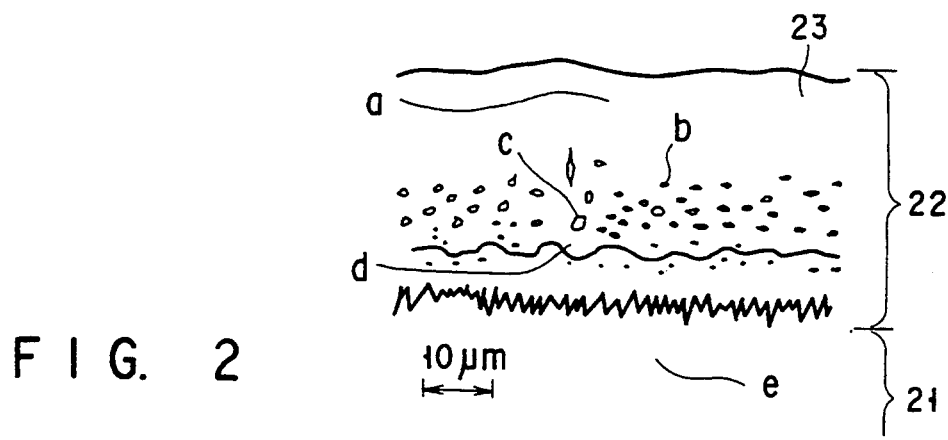
FIG. 2 is a sectional view showing a sample for observation of a section, which consists of a stainless steel thin plate on which a corrosion-protective layer according to Example 1 of the present invention is formed.

Separately, each sample buried in the resin was cut out by using the micro-cutter, and the cut surface was polished to form a sample for observation of a section. FIG. 2 shows the section of the corrosion-protective layer formed on the stainless steel thin plate. Referring to FIG. 2, reference numeral 21 denotes a stainless steel thin plate; 22, a corrosion-protective layer; and 23, an ordered alloy having $Al_{13}Fe_4$ structure. In addition, quantitative analysis was performed for the section of the corrosion-protective layer by using an X-ray microanalyzer. The results are shown in Table 1 below. Symbols a, b, c, d, and e in Table 1 indicate the quantitative analysis results at portions a, b, c, d, and e shown in FIG. 2. Table 1 shows the results such that the sum total of Al, Cr, Fe, Ni, and Si is 100 wt %.

TABLE 1

| Symbol | a | b | c | d | e |
|---|---|---|---|---|---|
| Al (wt %) | 61.9 | 50.5 | 30.7 | 57.9 | 0.0 |
| Cr (wt %) | 10.2 | 16.9 | 51.2 | 3.7 | 26.5 |
| Fe (wt %) | 19.9 | 27.0 | 17.2 | 37.2 | 54.2 |
| Ni (wt %) | 7.7 | 5.2 | 0.5 | 0.8 | 18.5 |
| Si (wt %) | 0.3 | 0.4 | 0.4 | 0.4 | 0.8 |

As is apparent from Table 1, no high-concentration silicon was detected in the corrosion-protective layer formed on the surface of the stainless steel member according to Example 1.

In addition, as shown in FIG. 2, a heterophase containing a large amount of chromium and having a diameter of 0.5 μm or more was precipitated in the portions b and c of the corrosion-protective layer 22, and no cracks existed in the layer 22. This result was consistent in 10 all the samples for section observation.

EXAMPLE 2

A metal aluminum layer 25 μm in thickness was vapor-deposited on the surface of a 0.3 mm thick thin plate consisting of stainless steel (SUS310S) by using a vapor deposition process. Subsequently, the resultant thin plate was placed in an oven having an atmosphere consisting of 3% of hydrogen and argon as the balance and heat-treated at a temperature of 800° C. for 10 hours. The thin plate was then oven-cooled at a rate of 1.5° C./min to manufacture a stainless steel member in which a corrosion-protective layer with a thickness of 22 μm was formed on the surface of the thin plate.

Following the same procedures as in Example 1, samples for X-ray diffraction and those for section observation were formed from the resultant stainless steel member.

The composition of the corrosion-protective layer was examined through X-ray diffraction analysis by using the X-ray diffraction samples. Consequently, Al(Fe,Ni) as an ordered alloy and $Al_8Cr_5$ as a heterophase containing chromium were detected.

Figure 3:
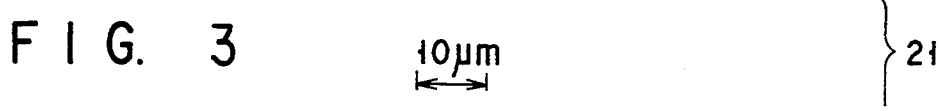
FIG. 3 is a sectional view showing a sample for observation of a section, which consists of a stainless steel thin plate on which a corrosion-protective layer according to Example 2 of the present invention is formed.

FIG. 3 shows the section of the sample for section observation. Referring to FIG. 3, reference numeral 21 denotes a stainless steel this plate; 22, a corrosion-protective layer; 24, an ordered alloy of Al (Fe, Ni); and 25, a heterophase containing a large amount of Cr.

As can be seen from FIG. 3, no cracks were present in the corrosion-protective layer 22 of the stainless steel member according to Example 2. This result was consistent in all the samples for section observation.

EXAMPLE 3

A metal aluminum layer 25 μm in thickness was vapor-deposited on the surface of a 0.3 mm thick thin plate consisting of stainless steel (SUS310S) by using a vapor deposition process. Subsequently, the resultant thin plate was placed in an oven having an atmosphere consisting of 3% of hydrogen and argon as the balance and heat-treated at a temperature of 800° C. for 25 hours. The thin plate was then oven-cooled at a rate of 1.5° C./min to manufacture a stainless steel member in which a corrosion-protective layer with a thickness of 37 μm was formed on the surface of the thin plate.

Following the same procedures as in Example 1, samples for X-ray diffraction and those for section observation were formed from the resultant stainless steel member.

The composition of the corrosion-protective layer was examined through X-ray diffraction analysis by using the X-ray diffraction samples. Consequently, Al(Fe,Ni) as an ordered alloy was detected, but $Al_8Cr_5$ as a heterophase containing chromium was detected only slightly.

The sections of the samples for section observation were analogous to that shown in FIG. 3 described above. The size of the heterophase containing chromium was smaller than that in Example 2. Although a few cracks were found in the corrosion-protective layer of the stainless steel member according to Example 3, these cracks existed only in the corrosion-protective layer and did not reach the surface of the thin plate.

Comparative Example 1

A metal aluminum layer 25 μm in thickness was vapor-deposited on the surface of a 0.3 mm thick thin plate consisting of stainless steel (SUS310S) by using a vapor deposition process. Subsequently, the resultant thin plate was placed in an oven having an atmosphere consisting of 3% of hydrogen and argon as the balance and heat-treated at a temperature of 950° C. for five hours. The thin plate was then oven-cooled at a rate of 0.5° C./min to manufacture a stainless steel member in which a corrosion-protective layer with a thickness of 60 μm was formed on the surface of the thin plate.

Following the same procedures as in Example 1, samples for X-ray diffraction and those for section observation were formed from the resultant stainless steel member.

The composition of the corrosion-protective layer was examined through X-ray diffraction analysis by using the X-ray diffraction samples. As a result, Al(Fe,Ni) as an ordered alloy was detected, but no heterophase containing chromium was detected.

Figure 4:
FIG. 4 is a sectional view showing a sample for observation of a section, which consists of a stainless steel thin plate on which a corrosion-protective layer according to Comparative Example 1 is formed.

FIG. 4 shows the section of the sample for section observation. As is apparent from FIG. 4, a large number of cracks 26 reaching the thin plate 21 were found in the corrosion-protective layer 22 of the stainless steel member of Comparative Example 1.

Comparative Example 2

A metal aluminum layer 25 μm in thickness was vapor-deposited on the surface of a 0.3 mm thick thin plate consisting of stainless steel (SUS310S) by using a vapor deposition process. Subsequently, the resultant thin plate was placed in an oven having an atmosphere consisting of 3% of hydrogen and argon as the balance and heat-treated at a temperature of 850° C. for five hours. The thin plate was then slowly cooled at a rate of 0.25° C./min to manufacture a stainless steel member in which a corrosion-protective layer with a thickness of 24 μm was formed on the surface of the thin plate.

Following the same procedures as in Example 1, samples for X-ray diffraction and those for section observation were formed from the resultant stainless steel member.

The composition of the corrosion-protective layer was examined through X-ray diffraction analysis by using the X-ray diffraction samples. As a result, Al(Fe,Ni) as an ordered alloy was detected, but no heterophase containing chromium was detected.

Figure 5:
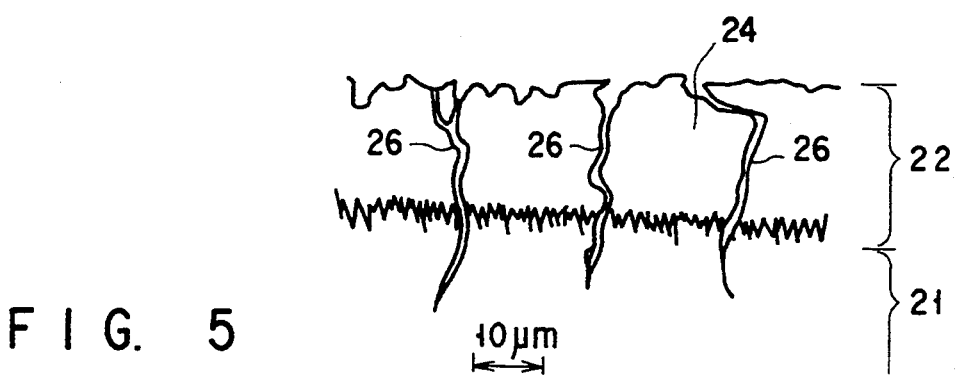
FIG. 5 is a sectional view showing a sample for observation of a section, which consists of a stainless steel thin plate on which a corrosion-protective layer according to Comparative Example 2 is formed.

FIG. 5 shows the section of the sample for section observation. As is apparent from FIG. 5, a large number of cracks 26 reaching the thin plate 21 were found in the corrosion-protective layer 22 of the stainless steel member of Comparative Example 2.

Comparative Example 3

An aluminum-containing layer 350 μm in thickness was formed on the surface of a 0.3 mm thick thin plate consisting of stainless steel (SUS310S) by following the same procedures as in Example 1. Subsequently, the resultant thin plate was placed in an oven having an argon atmosphere consisting of 3% of hydrogen. A binder in the aluminum-containing layer was volatilized by heat-treating at a temperature of 500° C. for twenty hours to form a metal aluminum layer and heat-treated at a temperature of 660° C. for one hour. The thin plate was then slowly cooled at a rate of 0.25° C./min to manufacture a stainless steel member. Note that when the stainless steel member was transferred from the oven, a large portion of the metal aluminum layer on the thin plate pealed from the thin plate.

Following the same procedures as in Example 1, samples for X-ray diffraction and those for section observation were formed from the resultant stainless steel member.

The composition of the surface was examined through X-ray diffraction analysis by using the X-ray diffraction samples. As a result, almost no Al(Fe,Ni) as an ordered alloy was detected, and no heterophase containing chromium was detected. What was detected was γ-Fe indicating the stainless steel (SUS310S).

In addition, it was confirmed from the sections of the section observation samples that the ordered alloy was distributed like islands on the surface of the thin plate consisting of the stainless steel (SUS310S).

Separately, edge seal plates were manufactured by forming corrosion-protective layers on 0.3 mm thick thin plates consisting of stainless steel (SUS310S) following the same procedures as in Examples 1 to 3 and Comparative Examples 1 and 2. In addition, edge seal plate was manufactured by treating 0.3 mm thick thin plate consisting of stainless steel (SUS310S) following the same procedures as in Comparative Example 3. The surface of this edge seal plate was formed an ordered alloy which was distributed like islands. Molten carbonate fuel cells with a stack structure shown in FIG. 1 mentioned earlier were assembled by using the resultant edge seal plates. These fuel cells were subjected to an electric power generating test at normal pressure and a current density of 150 mA/cm$^2$. The results are shown in FIG. 6.

Figure 6:
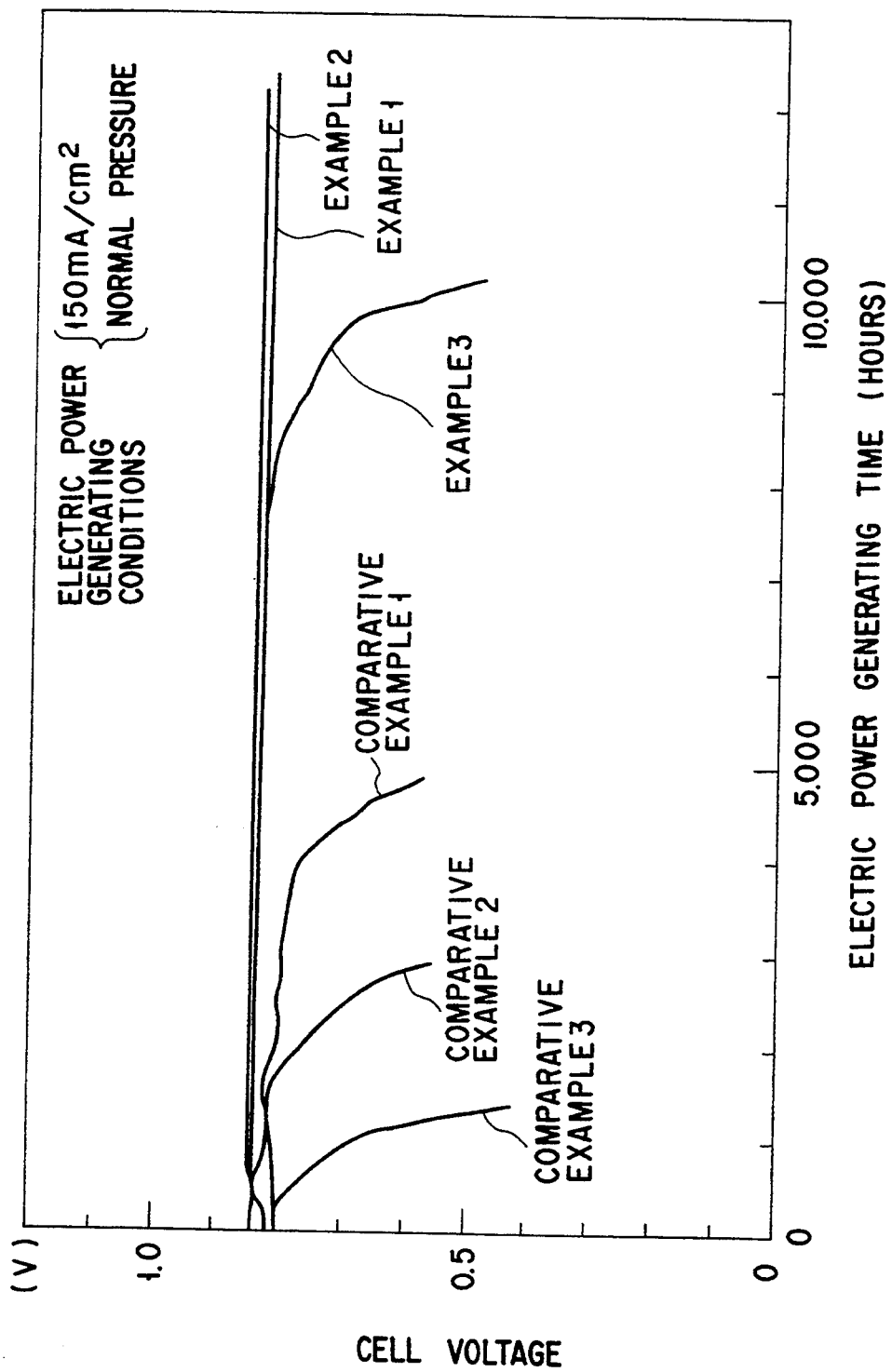
FIG. 6 is a graph showing the relationship between the electric power generating time and the cell voltage in molten carbonate fuel cells incorporating unit cells constituted by using edge seal thin plates on the surfaces of which corrosion-protective layers are formed following the same procedures as in Examples 1 to 3 and Comparative Examples 1 to 3.

As can be seen from FIG. 6, each of the molten carbonate fuel cells incorporating the edge seal plates having the corrosion-protective layers formed by the methods of Examples 1 and 2 had a high voltage of 0.8 v or more even after 10,000 hours, showing almost no drop in the cell voltage. In the molten carbonate fuel cell incorporating the edge seal plates having the corrosion-protective layer formed by the method of Example 3, the cell voltage began to drop from about 8,000 hours. At 10,000 hours, the stainless steel as the base material of the edge seal plates corroded, forming a corrosion product. The corrosion products on any two edge seal plates sandwiching the electrolyte body contacted each other. Furthermore, the corrosion products contacted a fuel electrode and an air electrode sandwiching the electrolyte body, respectively. Consequently, a short circuit was formed between the fuel electrode and the air electrode, abruptly lowering the cell voltage.

In each of the molten carbonate fuel cells incorporating the edge seal plates manufacturing by the methods of Comparative Examples 1 to 3, on the other hand, the stainless steel as the base material of the edge seal plates corroded within a short time period of 5,000 hours or less. The resultant corrosion product caused a short circuit between the anode and the cathode, and this abruptly decreased the cell voltage.

As has been described above, the stainless steel member according to the present invention has a high corrosion resistance and can therefore be effectively used as, e.g., edge seal plates of a molten carbonate fuel cell, which are used in direct contact with a highly corrosive molten carbonate.

In addition, according to the method of the present invention, it is possible to manufacture a stainless steel member with a high corrosion resistance by forming a corrosion-protective layer on the surface of a base material consisting of stainless steel without producing any cracks reaching the base material.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A stainless steel member comprising:
   a base material consisting of stainless steel containing chromium; and
   a corrosion-protective layer in which a granular heterophase containing chromium is precipitated in an ordered alloy consisting of aluminum and constituent elements of said base material, said corrosion-protective layer being formed on the surface of said base material.

2. The stainless steel member according to claim 1, wherein said stainless steel forming said base material consists of 10 to 27 wt. % of chromium, 0.1 to 30 wt. % nickel, not more than 0.8 wt. % of cobalt, not more than 2.0 wt. % of manganese, not more than 1.5 wt. % of silicon, the balance of iron, and not more than 0.1 wt. % of unavoidable impurity elements.

3. The stainless steel member according to claim 1, wherein said ordered alloy contains aluminum and, as main components of said base material, iron and nickel.

4. The stainless steel member according to claim 1, wherein said granular heterophase contains 15 to 60 wt % of chromium.

5. The stainless steel member according to claim 1, wherein said granular heterophase contains Al$_8$Cr$_5$ detectable by an X-ray diffraction analysis.

6. The stainless steel member according to claim 1, wherein said granular heterophase has a grain size of 0.5 to 15 μm.

7. The stainless steel member according to claim 1, wherein
   said corrosion-protective layer has a thickness of 20 to 100 μm, and
   said granular heterophase is distributed in a region with a thickness of 5 to 40 μm from an interface between said base material and said corrosion-protective layer toward said corrosion-protective layer.

8. The stainless steel member according to claim 1, wherein said corrosion-protective layer is formed by coating an aluminum layer on the surface of said base material and performing a heat-treatment in a non-oxidizing atmosphere at a temperature of 670° to 840° C.

9. The stainless steel member according to claim 1, wherein said stainless steel member is an edge seal plate, and a surface layer of said edge seal plate to be brought into contact with the peripheral portion of an electrolyte body consists of said corrosion-protective layer.

10. A method for manufacturing a stainless steel member, comprising the steps of:
    forming an aluminum layer on the surface of a base material consisting of stainless steel; and
    performing a heat treatment in a non-oxidizing atmosphere at a temperature of 670° to 840° C., thereby forming, on the surface of said base material, a corrosion-protective layer in which a granular heterophase containing chromium is precipitated in an ordered alloy consisting of aluminum and constituent elements of said base material.

11. The method according to claim 10, wherein said stainless steel forming said base material consists of 10 to 27 wt. % of chromium, 0.1 to 30 wt. % of nickel, not more than 0.08 wt. % of cobalt, not more than 2.0 wt. % of manganese, not more than 1.5 wt. % of silicon, the balance of iron, and not more than 0.1 wt. % of unavoidable impurity elements.

12. The method according to claim 10, wherein said aluminum layer is formed by coating a slurry containing an aluminum powder and a binder on the surface of said base material and removing said binder.

13. The method according to claim 12, wherein said aluminum powder has a grain size of 1 to 50 μm.

14. The method according to claim 12, wherein said aluminum layer has a thickness of 100 μm to 1500 μm.

15. The method according to claim 10, wherein said aluminum layer is formed by using a vapor deposition process.

16. The method according to claim 15, wherein said aluminum layer has a thickness of 20 μm to 100 μm.

17. The method according to claim 10, wherein the heat treatment is performed at a temperature ranging between 780° and 820° C.

18. The method according to claim 10, wherein said heat-treatment is performed to satisfy a relation of $0.1 < H < 0.02 \times 10^{(3300/T)}$, where H is the heat-treating time (hour) and T is the heat-treating temperature falling within a range of between 943K and 1113K.

* * * * *